United States Patent [19]

Okada et al.

[11] Patent Number: 4,468,581
[45] Date of Patent: Aug. 28, 1984

[54] DRIVE CIRCUIT FOR A PIEZOELECTRIC RESONATOR USED IN A FLUIDIC GAS ANGULAR RATE SENSOR

[75] Inventors: Yasushi Okada, Asaka; Fumitaka Takahashi, Hoya; Katsutoshi Tagami, Asaka, all of Japan

[73] Assignee: Honda Giken Kogyo Kabushiki Kaisha, Tokyo, Japan

[21] Appl. No.: 392,067

[22] Filed: Jun. 25, 1982

[30] Foreign Application Priority Data

Jun. 25, 1981 [JP] Japan .................................. 56-98621

[51] Int. Cl.³ ............................................ H01L 41/08
[52] U.S. Cl. .................................................. 310/316
[58] Field of Search ............... 310/316, 317, 311, 328; 73/516 R, 516 LM, 497

[56] References Cited

U.S. PATENT DOCUMENTS

| | | | |
|---|---|---|---|
| 3,107,630 | 10/1963 | Johnson et al. | 310/317 X |
| 3,447,051 | 5/1969 | Attwood et al. | 310/316 X |
| 3,819,961 | 6/1974 | Bourgeois et al. | 310/316 |
| 3,842,340 | 10/1974 | Brandquist | 310/316 X |
| 3,931,533 | 1/1976 | Raso | 310/316 |
| 3,975,650 | 8/1976 | Payne | 310/316 |
| 4,020,699 | 5/1977 | Schaffer | 73/516 LM |
| 4,271,371 | 6/1981 | Furuichi et al. | 310/316 |
| 4,275,363 | 1/1981 | Mishiro et al. | 310/316 X |
| 4,277,758 | 7/1981 | Mishiro | 310/316 X |

*Primary Examiner*—Mark O. Budd
*Attorney, Agent, or Firm*—Armstrong, Nikaido, Marmelstein & Kubovcik

[57] ABSTRACT

The present invention is directed to a phase locked driving circuit for a piezoelectric pump in a fluidic gas angular rate sensor in which the driving circuit comprises a voltage controlled oscillator for providing an oscillating drive signal to the piezoelectric pump. A phase difference detector is coupled to the output of the oscillator for detecting the phase of the current of the output signal and the phase of the voltage of the output signal and for providing an output indicative of the phase difference therebetween. An error amplifier is coupled to the phase difference detector for comparing the phase difference to a predetermined phase difference and for producing a voltage indicative thereof. The voltage of the error detecting circuit is applied to the control input of the voltage controlled oscillator for controlling the output thereof.

6 Claims, 4 Drawing Figures

DRIVE CIRCUIT FOR A PIEZOELECTRIC RESONATOR USED IN A FLUIDIC GAS ANGULAR RATE SENSOR

BACKGROUND OF THE INVENTION

1. Field of the Invention

This application is directed to a fluidic gas angular rate sensor and more particularly to a phase locked driving circuit for a piezoelectric pump in a fluidic gas angular rate sensor.

2. Description of the Prior Art

In prior art fluidic gas angular rate sensors, such as those shown in U.S. Pat. Nos. 3,500,691, 4,020,699 and 4,020,700, the angular movement of a body is detected by measuring a temperature differential between two temperature sensors. Typically, a gas flow is produced by means of a piezoelectric pump and the gas flow is directed towards two temperature sensing elements in a closed jet chamber. The flow of gas is such that the flow is directed equally at the two temperature sensors thereby maintaining the temperature of each sensor equal. When the body on which the sensor is mounted undergoes an angular displacement, the flow of gas is deflected and thus the flow striking each of the temperature sensors becomes unequal resulting in a temperature differential between the two temperature sensors. This temperature differential is indicative of the angular displacement of the body.

One of the problems in prior art fluidic gas angular rate sensors is inaccuracies which are introduced by variations in gas flow caused by instability in the operation of the piezoelectric pump.

SUMMARY OF THE INVENTION

It is the primary object of the present invention to provide a fluidic gas angular rate sensor which includes a piezoelectric pump having a stabilized operation.

It is another object of the present invention to provide a phase locked driving circuit for a piezoelectric pump in a fluidic gas angular rate sensor, the phase locked driving circuit producing uniform and stable operation of the piezoelectric pump.

The present invention is directed to a phase locked driving circuit for a piezoelectric pump in a fluidic gas angular rate sensor in which the driving circuit comprises a voltage controlled oscillator for providing an oscillating drive signal to the piezoelectric pump. A phase difference detector is coupled to the output of the oscillator for detecting the phase of the current of the output signal and the phase of the voltage of the output signal and for providing an output indicative of the phase difference therebetween. An error amplifier is coupled to the phase difference detector for comparing the phase difference to a predetermined phase difference and for producing a voltage indicative thereof. The voltage of the error detecting circuit is applied to the control input of the voltage controlled oscillator for controlling the output thereof.

DETAILED DESCRIPTION OF THE PREFERRED EMBODIMENTS

Figure 1:
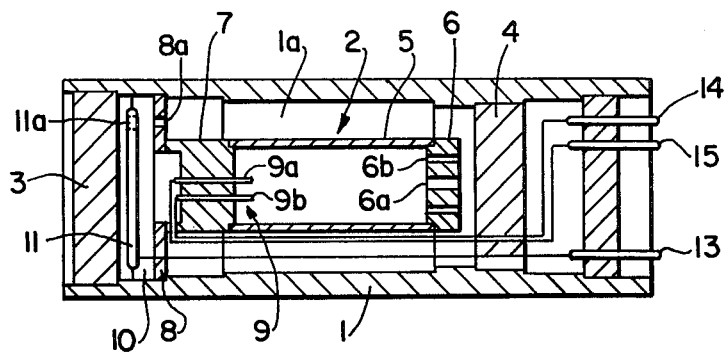
FIG. 1 is a sectional view of a fluidic gas angular rate sensor incorporating the present invention.

Referring to FIG. 1, the fluidic gas angular rate sensor comprises a casing 1 having a chamber 2 positioned within the casing. The ends of the sensor chamber 2 are closed by means of end covers 3 and 4. A cylindrical sleeve 5 is positioned within the chamber 2 and a nozzle piece 6 is fixed to one end of the sleeve 5. The nozzle piece 6 includes a nozzle hole 6a and rectification holes 6b. An end holder 7 is fixed to the other end of sleeve 5 with the end holder 7 being fixed to the casing 1 through a plate 8.

A flow sensor 9 is mounted in the holder 7 and is positioned at the opposite end of cylinder 5 from the nozzle piece 6. The flow sensor 9, which includes temperature sensing elements 9a and 9b positioned a predetermined distance apart, detects the gas flow through nozzle 6. When the gas flow is straight, the temperature sensors 9a and 9b detect the same flow, however, when gas flows through nozzle 6a and is deflected by a change in the angle of orientation of casing 1, the temperature sensors detect a difference indicative of the angle change.

A piezoelectric pump chamber 10 is formed between the holder 7 and the end cover 3. A piezoelectric pump diaphragm 11 having a pump orifice 11a is mounted in the piezoelectric pump chamber 10. The piezoelectric pump diaphragm 11 has a vibration element 12 which vibrates as a function of the voltage applied thereto through connecting terminal 13 and the gas within the piezoelectric pump chamber 10 is pumped by means of the vibration of the piezoelectric element.

Pumped gas flows through outlet orifice 8a of plate 8 into fluid conduit 1a and flows toward end cover 4. The pumped gas then flows into sleeve 5 through nozzle 6a and flows towards temperature sensing elements 9a and 9b of flow sensor 9. The temperature sensing elements 9a and 9b detect the difference in gas flow rate and produce an electrical resistance change in accordance with the temperature of the gas. The temperature sensing elements 9a and 9b may be, for example, heat sensitive wires which are connected with a detecting circuit such as a bridge circuit (not shown) through connecting terminals 14 and 15.

When the body upon which the angular rate sensor is mounted is moving straight ahead, gas flow through nozzle 6 is directed within sleeve 5 from the nozzle 6a to the mid-point between the two temperature sensing elements 9a and 9b. Temperature changes of the temperature sensing elements thus, remains equal and, therefore, the resistance is equal resulting in a difference of 0. However, when the object upon which the sensor is mounted changes direction, the flow of gas in sleeve 5 from the nozzle 6a is deflected causing a greater temperature change on one of the sensing elements 9a and 9b, which results in a difference in the resistances of the sensing elements. This resistance difference produces an output indicative of the angular displacement.

In order to stabilize the flow of gas in the sensor, it is necessary to provide stable operation for the diaphragm 11 of the piezoelectric pump 10. This is accomplished using a phase locked driving circuit.

Figure 2:
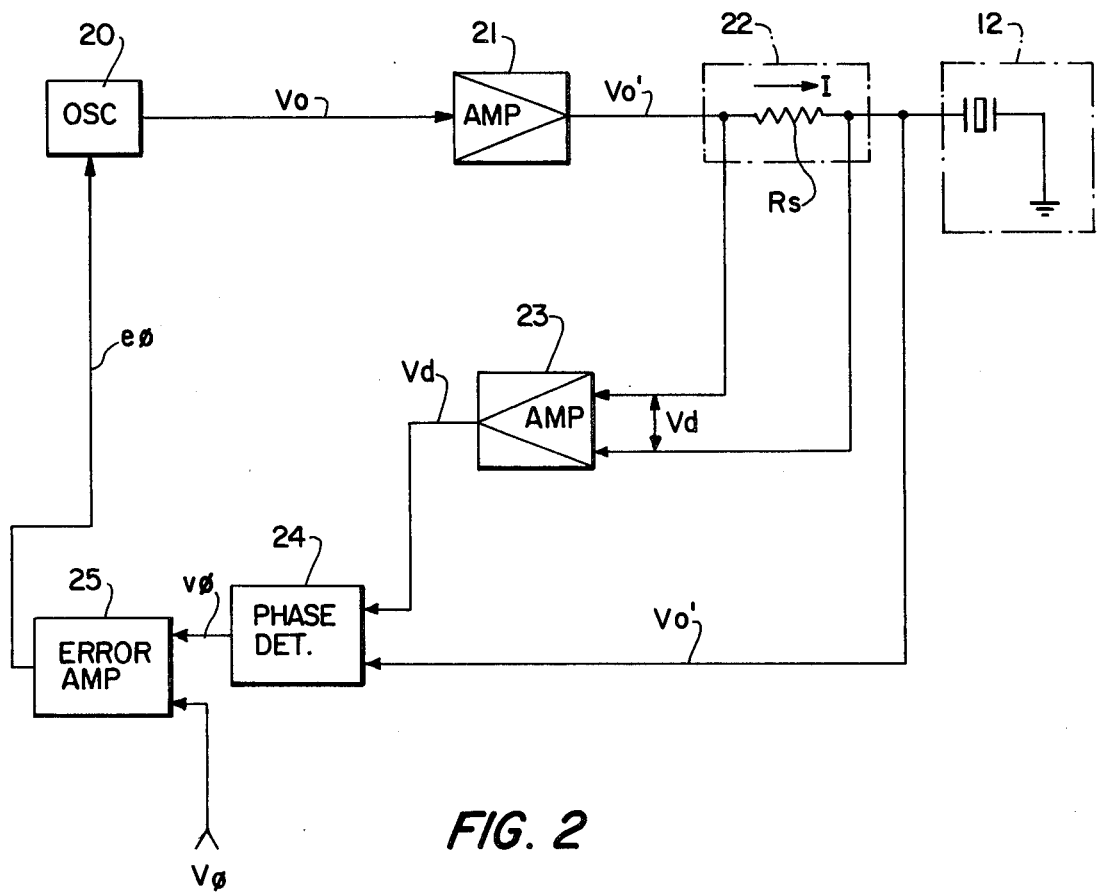
FIG. 2 is a schematic diagram of a first embodiment of the phase locked piezoelectric element driving circuit of the present invention.

Referring to FIG. 2, a voltage controlled oscillator 20 produces an output signal Vo which is amplified by amplifier 21, producing an output Vo', which is applied to piezoelectric element 12. The piezoelectric element 12 vibrates at a rate and amplitude in accordance with the frequency and amplitude of the amplified oscillator output Vo'. The piezoelectric element 12 vibrates the diaphragm 11 shown in FIG. 1.

In order to stabilize the vibration of the piezoelectric element 12, a current detecting circuit 22, which includes a shunt resistor $R_s$, detects the driving current I of the piezoelectric element 12 and produces a voltage Vd in accordance therewith. This voltage is amplified by amplifier 23, the output of which is applied to one input of the phase difference detector 24. The piezoelectric element driving voltage Vo' is applied to the other input of the phase difference detector 24. The phase difference detector 24 detects the phase difference $\phi$ between the voltage Vd and Vo' and produces an output voltage V$\phi$ in accordance therewith. The phase difference signal v$\phi$ is applied to one input of error amplifier 25. The other input to error amplifier 25 has a fixed phase difference voltage V$\phi$ applied thereto. The predetermined phase difference voltage V$\phi$ is selected in accordance with the desired operating characteristics of the piezoelectric element 12.

Error amplifier 25 determines the difference between v$\phi$ and the predetermined phase difference signal V$\phi$ (V$\phi$−v$\phi$) and produces a control signal e$\phi$ as a function of the difference. The voltage a$\phi$ is applied to the control input of the voltage controlled oscillator 20 for controlling the frequency of the output thereof.

Figure 3:
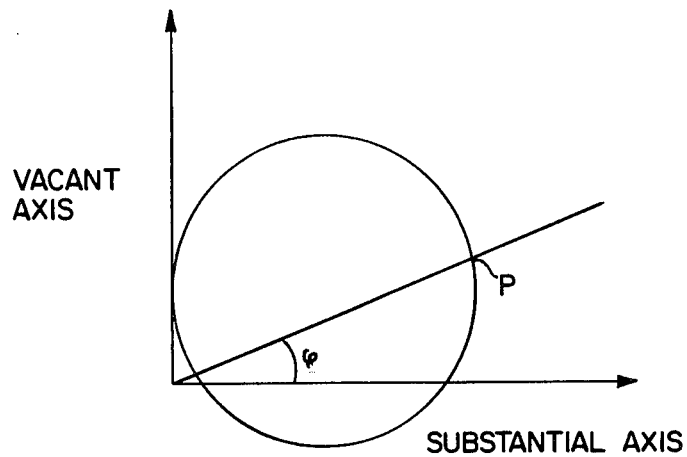
FIG. 3 is a schematic admittance characteristic of a piezoelectric element.

The phase difference $\phi$ between the driving voltage and the driving current of the piezoelectric element 12 changes along an admittance circle of the piezoelectric vibration element 12 as shown in FIG. 3, when the frequency of the output signal Vo of the voltage controlled oscillator 20 changes. the voltage controlled oscillator 20, amplifier 21, phase detector 24 and error amplifier 25 form a phase locked driving circuit for driving the piezoelectric vibration element 12 at a fixed phase difference $\phi$ between the voltage and current applied thereto. The operating point of the piezoelectric vibration element 12 is shown at point P of the admittance circle of FIG. 3 when it is driven at the fixed phase difference $\phi$.

Figure 4:
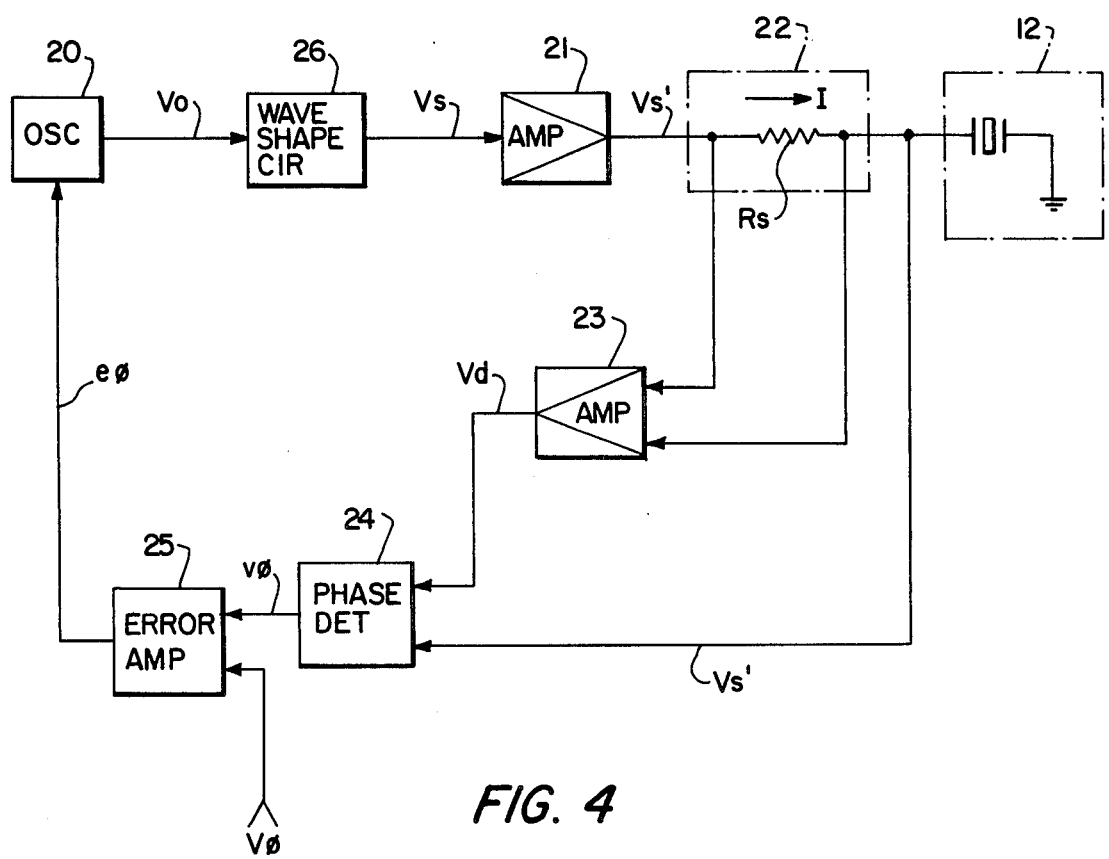
FIG. 4 is a schematic diagram of a second embodiment of the present invention.

Referring to FIG. 4, when the output of the voltage controlled oscillator 20 is a square wave or has a triangular wave shape, it may be desirable to drive the piezoelectric vibration element 12 with a sine wave in order to reduce distortion. The square wave or triangular wave output signal can be converted to a sine wave by the insertion of a wave shaping circuit 26 as shown in FIG. 4. The sine wave signal Vs is amplified by amplifier 21, the output of which Vs' is applied to the piezoelectric vibration element 12 as the driving voltage therefor. The other elements shown in FIG. 4 are the same as those shown in the circuit of FIG. 2.

It is also possible to select a voltage controlled oscillator 20 which is a sine wave oscillator having a voltage controlled filter rather than using a square wave or triangular wave oscillator. When using a sine wave oscillator 20, it is, of course, not necessary to use a wave shaping circuit 26.

Using a phase locked driving circuit of the present invention for driving the piezoelectric pump in a gas angular rate sensor, the gas flow rate can be stabilized even if the resonance frequency or resonance characteristic of the piezoelectric pump changes because of temperature or aging. Further, the phase difference between the driving voltage and driving current of the piezoelectric vibration element can be selected to optimize efficiency.

Still further, noise in the oscillation can be reduced by using a sine wave driving voltage for the piezoelectric vibration element. This is a big factor in countering noise which occurs in prior art devices. The phase difference detector operates in a very accurate manner because distortion of the driving current is small and thus, the piezoelectric vibration element is driven very accurately. All of these factors produce a very stable gas flow rate.

The present invention may be embodied in other specific forms without departing from the spirit or essential characteristics thereof. The presently disclosed embodiments are, therefore, to be considered in all respects as illustrative and not restrictive, the scope of the invention being indicated by the appended claims, rather than the foregoing description, and all changes which come within the meaning and range of equivalency of the claims are, therefore, to be embraced therein.

What is claimed is:

1. A phase locked driving circuit for a piezoelectric pump in a gas angular rate sensor, said driving circuit comprising:
    (a) voltage controlled oscillator means for providing an oscillating drive signal to said piezoelectric pump;
    (b) phase difference detector means coupled to the output of said oscillator means, for detecting the phase of the current of said output signal and the phase of the voltage of said output signal and for providing an output indicative of the phase difference therebetween; and
    (c) error amplifier means, coupled to said phase difference detector means, for comparing said phase difference output of the phase difference detector means to a predetermined phase difference signal and for producing an error voltage indicative of the difference between the predetermined phase difference signal and the output of the phase difference detector means, said error voltage being applied to the control input of said voltage controlled oscillator means for controlling the output thereof.

2. A phase locked driving circuit for a piezoelectric pump as set forth in claim 1, wherein said phase detector means includes a shunt resistor connected in series with said oscillator means and said piezoelectric pump such that the said drive signal flows therethrough and means for measuring the voltage across said shunt resistor, said means being coupled to said phase difference detector means.

3. A phase locked driving circuit for a piezoelectric pump as set forth in any one of claims 1 or 2, including wave shaping means coupled to the output of said voltage controlled oscillator means for shaping the output thereof.

4. A phase locked driving circuit for a piezoelectric pump as set forth in claim 3, wherein said wave shaping circuit forms a sine wave from said output signal.

5. A phase locked driving circuit for a piezoelectric pump as set forth in any one of claims 1 or 2, wherein said voltage controlled oscillator means provides a sine wave output.

6. A phase locked driving circuit for a piezoelectric pump as set forth in claim 5, wherein said voltage controlled oscillator means includes a voltage controlled filter.

* * * * *